US012283244B2

(12) United States Patent
Li et al.

(10) Patent No.: US 12,283,244 B2
(45) Date of Patent: Apr. 22, 2025

(54) DISPLAY SUBSTRATE AND DISPLAY PANEL (71) Applicants: Chengdu BOE Optoelectronics Technology Co., Ltd., Sichuan (CN); BOE TECHNOLOGY GROUP CO., LTD., Beijing (CN)

(72) Inventors: Huijun Li, Beijing (CN); Tinghua Shang, Beijing (CN); Siyu Wang, Beijing (CN); Yan Huang, Beijing (CN); Lulu Yang, Beijing (CN); Tingliang Liu, Beijing (CN); Huijuan Yang, Beijing (CN); Xiaofeng Jiang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/740,752

(22) Filed: Jun. 12, 2024

(65) Prior Publication Data
US 2024/0331637 A1 Oct. 3, 2024

Related U.S. Application Data (63) Continuation of application No. 17/417,210, filed as application No. PCT/CN2020/114616 on Sep. 10, 2020, now Pat. No. 12,046,195.

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ............ H10K 59/1213; H10K 59/131; H10K 59/126; H10K 59/353; H10K 59/352;
(Continued)

(56) References Cited

U.S. PATENT DOCUMENTS

2013/0201172 A1  8/2013  Jeong et al.
2015/0170563 A1  6/2015  Bang
(Continued)

FOREIGN PATENT DOCUMENTS

CN  107293566 A  10/2017
CN  107871757 A   4/2018
(Continued)

OTHER PUBLICATIONS

China Patent Office, First Office Action dated Apr. 29, 2023, for corresponding Chinese application 202080002445.7.
(Continued)

*Primary Examiner* — Mouloucoulaye Inoussa
(74) *Attorney, Agent, or Firm* — HOUTTEMAN LAW LLC (57) ABSTRACT A display substrate, including a base substrate, and a driving circuit layer and light emitting elements formed on the base substrate, and in a same pixel circuit, an active general layer includes a first column-wise active portion including active layers of a data writing transistor and a first light emission control transistor, and a first active connection portion, an orthographic projection of the first active connection portion on the base substrate at least partially overlapping an orthographic projection of a corresponding power supply line on the base substrate, a dimension of the first active connection portion in a row direction of the pixel units less than a dimension of the active layer of the data writing transistor in the row direction, and a dimension of the active layer of the
(Continued)

first light emission control transistor in the row direction. A display panel is further provided.

20 Claims, 5 Drawing Sheets

(51) Int. Cl.
*H10K 59/126* (2023.01)
*H10K 59/131* (2023.01)

(52) U.S. Cl.
CPC ............ *G09G 2300/0426* (2013.01); *G09G 2300/0809* (2013.01); *G09G 2320/0209* (2013.01); *H10K 59/126* (2023.02)

(58) Field of Classification Search
CPC ............ H10K 59/805; H10K 50/805; H10K 59/1216; G09G 3/3233; G09G 3/3275; G09G 3/3266; G09G 3/2007; G09G 2300/0809; G09G 2300/0426; G09G 2320/0209; G09G 2310/0278; G09G 2320/0233; G09G 2300/0452; G09G 2320/045; G09G 2300/0861; G09G 2310/0262; G09G 2300/0852; G09G 2300/0819; G09G 2300/0842; G09G 2320/0214; G09G 2320/0238; G09G 2310/08; G09G 2320/0247; H01L 27/1255; H01L 27/124; H01L 27/1222; H01L 27/1214; H01L 29/78645; H01L 27/1203; H01L 29/78696
See application file for complete search history.

(56) References Cited

U.S. PATENT DOCUMENTS

| | | |
|---|---|---|
| 2015/0187959 A1 | 7/2015 | Yoon |
| 2016/0163780 A1 | 6/2016 | Park |
| 2016/0322445 A1 | 11/2016 | Lee et al. |
| 2017/0141177 A1 | 5/2017 | Kim et al. |
| 2017/0330928 A1 | 11/2017 | Choi et al. |
| 2018/0062102 A1 | 3/2018 | Kim |
| 2018/0212014 A1 | 7/2018 | Choi |
| 2019/0088200 A1 | 3/2019 | Woo et al. |
| 2019/0288052 A1 | 9/2019 | Choi et al. |
| 2019/0304373 A1 | 10/2019 | Wang et al. |
| 2019/0331968 A1 | 10/2019 | Matsushima et al. |
| 2020/0168686 A1 | 5/2020 | Han et al. |
| 2020/0184903 A1 | 6/2020 | Cho et al. |
| 2020/0266216 A1 | 8/2020 | Lee et al. |
| 2020/0395424 A1 | 12/2020 | Hwang et al. |
| 2021/0074213 A1 | 3/2021 | Huang et al. |
| 2021/0083035 A1 | 3/2021 | Yun et al. |
| 2021/0280652 A1 | 9/2021 | Kim et al. |
| 2021/0358420 A1 | 11/2021 | Yang et al. |
| 2021/0384229 A1 | 12/2021 | Lee et al. |

FOREIGN PATENT DOCUMENTS

| | | |
|---|---|---|
| CN | 108110013 A | 6/2018 |
| CN | 108878494 A | 11/2018 |
| CN | 110114885 A | 8/2019 |
| CN | 110648629 A | 1/2020 |
| CN | 110707237 A | 1/2020 |
| CN | 209912874 U | 1/2020 |
| CN | 111179855 A | 5/2020 |
| CN | 210984240 U | 7/2020 |
| CN | 111508977 A | 8/2020 |
| CN | 111584599 A | 8/2020 |
| EP | 3343630 A1 | 7/2018 |
| JP | 2007148219 A | 6/2007 |
| KR | 1020180131149 A | 12/2018 |

OTHER PUBLICATIONS

USPTO, Notice of Allowance dated Apr. 3, 2023, for corresponding U.S. Appl. No. 17/427,470.
WIPO, International Search Report issued on May 21, 2021regarding PCT international application No. PCT/CN2020/114616.
WIPO, International Search Report issued on Jun. 4, 2021 regarding PCT international application No. PCT/CN2020/123575.
USPTO, Notice of Allowance issued on Apr. 5, 2024 regarding U.S. Appl. No. 17/417,210.
USPTO, corrected Notice of Allowance issued on Jul. 12, 2023 regarding U.S. Appl. No. 17/427,470.
USPTO, Office action issued on Dec. 6, 2023 regarding U.S. Appl. No. 17/417,210.

DISPLAY SUBSTRATE AND DISPLAY PANEL

CROSS-REFERENCE TO RELATED APPLICATIONS

This is a Continuation of U.S. patent application Ser. No. 17/417,210, filed Jun. 22, 2021, a National Phase Application filed under 35 U.S.C. 371 as a national stage of PCT/CN2020/114616 filed on Sep. 10, 2020, the content of which is hereby incorporated by reference in its entirety.

TECHNICAL FIELD

The present disclosure relates to the field of display technology, and in particular, to a display substrate and a display panel.

BACKGROUND

Organic Light-Emitting Diode (OLED) display devices have been widely used due to their advantages of wide color gamut, solid-state light emission, capability of being made into flexible display devices, and the like.

As people have higher and higher requirements for display definition, the resolution of the organic light emitting diode display panel is also required to be higher and higher accordingly.

SUMMARY

An object of the present disclosure is to provide a display substrate and a display panel.

As a first aspect of the present disclosure, there is provided a display substrate, the display substrate includes a base substrate, and a plurality of light emitting elements and a driving circuit layer formed on the base substrate, the display substrate is divided into a plurality of pixel units arranged in a plurality of rows and a plurality of columns, the driving circuit layer includes a plurality of pixel circuits corresponding to the plurality of pixel units, the pixel circuits are configured to drive the light emitting elements to emit light, the driving circuit layer includes an active pattern layer and a source-drain pattern layer along a thickness direction of the display substrate, the source-drain pattern layer is arranged on a side of the active pattern layer away from the base substrate, the source-drain pattern layer includes a plurality of power supply lines and a plurality of data lines, length directions of the power supply lines and the data lines are the same as a column direction of the pixel units, each column of pixel units correspond to the power supply line and the data line, and the power supply line and the data line corresponding to the same column of pixel units are arranged on a same side of the column of pixel units;

the pixel circuit includes a plurality of thin film transistors, and in the same pixel unit, active layers of the thin film transistors of the pixel circuit is formed into an active general layer with an integrated structure in a single piece, and the active pattern layer includes a plurality of active general layers;

the thin film transistors of the pixel circuit include a data writing transistor and a first light emission control transistor, and in the same pixel circuit, the active general layer includes a first column-wise active portion including the active layer of the data writing transistor, the active layer of the first light emission control transistor, and a first active connection portion connected between the active layer of the data writing transistor and the active layer of the first light emission control transistor, an orthographic projection of the first active connection portion on the base substrate at least partially overlaps an orthographic projection of the corresponding power supply line on the base substrate, a dimension of the first active connection portion in a row direction of the pixel units is less than a dimension of the active layer of the data writing transistor in the row direction of the pixel units, and the dimension of the first active connection portion in the row direction of the pixel units is less than a dimension of the active layer of the first light emission control transistor.

In some implementations, the thin film transistors of the pixel circuit include a first reset transistor for resetting an anode of the light emitting element;

in the thickness direction of the display substrate, the driving circuit layer includes a first gate pattern layer and a second gate pattern layer which are arranged in a stacked mode, the first gate pattern layer and the second gate pattern layer are located between the active pattern layer and the source-drain pattern layer, and the second gate pattern layer is located on a side, away from the active pattern layer, of the first gate pattern layer;

the first gate pattern layer includes a reset signal line, the second gate pattern layer includes an initial signal line, the source-drain pattern layer further includes an initialization connector, one end of the initialization connector is electrically coupled to an initial signal line through a through hole, another end of the initialization connector is coupled to a part, corresponding to the first reset transistor, of the active general layer through a through hole, a length direction of the initialization connector is consistent with the column direction of the pixel units, and a distance between column-directional centerlines of through holes at two ends of the initialization connector is less than or equal to a preset distance.

In some implementations, the preset distance is between 0.1 μm and 0.5 μm.

In some implementations, there is an overlap between an orthogonal projection of the through hole at one end of the initialization connector on a reference line extending in the row direction and an orthogonal projection of the through hole at another end of the initialization connector on the reference line.

In some implementations, the active general layer includes a second column-wise active portion, the second column-wise active portion includes the active layer of the first reset transistor, and an orthographic projection of the initialization connector on the base substrate partially overlaps an orthographic projection of the second column-wise active portion on the base substrate.

In some implementations, the pixel circuit includes a second reset transistor and a driving transistor, the second reset transistor is configured to reset a gate of the driving transistor;

the active general layer further includes a third column-wise active portion and a fourth column-wise active portion, the third column-wise active portion is coupled to the second column-wise active portion through a second active connection portion, the fourth column-wise active portion is coupled to the third column-wise active portion through a third active connection portion, and one end of the third column-wise active portion is coupled to the second active connection portion, another end of the third column-wise active portion is coupled to the third active connection portion, and the corresponding reset signal line sequentially passes through the second column-wise active portion, the third column-wise active portion, and the fourth column-wise active portion, a part of the second column-wise active portion passed by the reset signal line is formed as the active layer of the first reset transistor, parts of the third column-wise active portion and the fourth column-wise active portion passed by the reset signal line are formed as the active layer of the second reset transistor;

the through hole corresponding to the another end of the initialization connector is positioned in the second active connection portion.

In some implementations, the first gate pattern layer further includes a plurality of gate lines, each row of pixel units correspond to the gate line, the pixel circuit includes a compensation transistor, the gate line includes a transverse gate line portion and a longitudinal gate line portion, each pixel unit corresponds to one longitudinal gate line portion, and the active layer of the compensation transistor includes a portion of the active general layer passing through the transverse gate line portion and a portion of the active general layer passing through the longitudinal gate line portion.

In some implementations, each four adjacent pixel units constitute a pixel unit group, and the four pixel units are respectively one red pixel unit, two green pixel units and one blue pixel unit.

In some implementations, in the same pixel unit group, an arrangement order of the four pixel units in the row direction is:

the blue pixel unit, the green pixel unit, the red pixel unit and the green pixel unit.

In some implementations, the display substrate further includes a planarization layer having pixel openings corresponding to the pixel units, a part of the light emitting element except the anode being disposed in the pixel opening, among the four pixel units of the same pixel unit group, the pixel opening corresponding to the blue pixel unit has the largest dimension along the row direction, and the pixel opening corresponding to the red pixel unit has the smallest dimension along the row direction.

In some implementations, the display substrate further includes a plurality of pad width members disposed on in the same layer as the data lines, each red pixel unit is provided with the pad width member therein, and the pad width member is disposed on a side of the red pixel unit away from the blue pixel unit.

In some implementations, an orthogonal projection of the pad width member on the base substrate is located in an overlapping portion of an orthogonal projection of an anode pattern of the red pixel unit provided with the pad width member on the base substrate and an orthogonal projection of the pixel opening of the red pixel unit on the base substrate.

In some implementations, a length direction of the pad width member coincides with a length direction of the data line.

In some implementations, the source-drain pattern layer includes a plurality of anode connectors, each light emitting element corresponds to one anode connector, the anode connector is electrically coupled to the anode pattern of the corresponding light emitting element, for the same row of pixel units, the anode connectors corresponding to the light emitting elements are arranged in a row, the pixel opening of the blue pixel unit, the pixel opening of the red pixel unit, and the pixel opening of the green pixel unit located at a side of the pixel opening of the red pixel unit away from the pixel opening of the blue pixel unit are located at a side of the row formed by the anode connectors, and the pixel opening of the green pixel unit located between the pixel opening of the red pixel unit and the pixel opening of the blue pixel unit is located at another side of the row formed by the anode connectors.

As a second aspect of the present disclosure, there is provided a display panel, which includes the display substrate provided above in the present disclosure.

DESCRIPTION OF DRA WINGS

The accompanying drawings, which are included to provide a further understanding of the present disclosure and are incorporated in and constitute a part of this specification, illustrate embodiments of the present disclosure and together with the description serve to explain the principles of the present disclosure and do not to limit the present disclosure. In the drawings.

DESCRIPTION OF EMBODIMENTS

The following describes in detail embodiments of the present disclosure with reference to the drawings. It should be understood that the detailed description and specific examples, while indicating exemplary embodiments of the present disclosure, are given by way of illustration and explanation only, not limitation.

As a first aspect of the present disclosure, there is provided a display substrate including a base substrate, a driving circuit layer and a plurality of light emitting elements formed on the base substrate. The display substrate is divided into a plurality of pixel units which are arranged in a plurality of rows and a plurality of columns, the driving circuit layer includes a plurality of pixel circuits corresponding to the pixel units, and the pixel circuits are configured to drive the light emitting elements to emit light.

In the present disclosure, a specific circuit structure of the pixel circuit is not particularly limited. It is to be noted that, in order to realize a data writing function, the pixel circuit should have a data writing transistor, and in order to realize a control of light emission timing of the light emitting element, the pixel circuit should have at least a first light emission control transistor.

Figure 1:
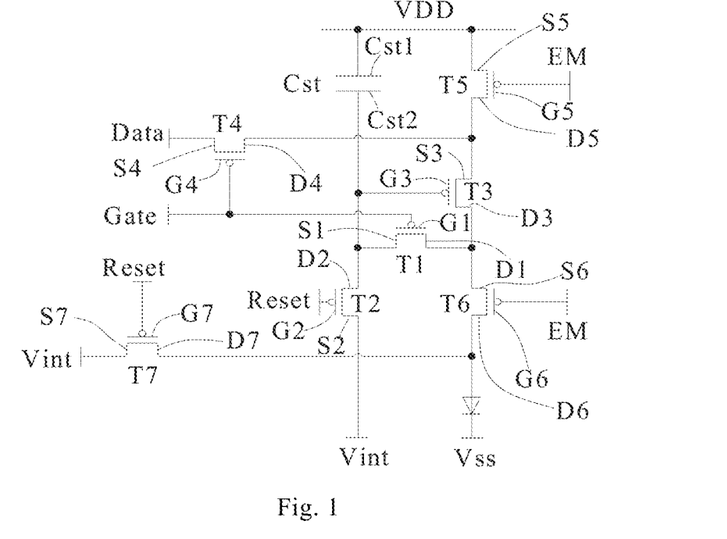
FIG. 1 is an equivalent circuit diagram of a pixel circuit of a display panel according to an embodiment of the present disclosure.

As an alternative implementation, the pixel circuit may be a 7T1C pixel circuit. FIG. 1 shows a pixel circuit of 7T1C, and particularly, the pixel circuit includes a compensation transistor T1, a second reset transistor T2, a driving transistor T3, a data writing transistor T4, a first light emission control transistor T5, a second light emission control transistor T6, a first reset transistor T7, and a compensation capacitor Cst. Accordingly, a second wiring includes a gate line Gate, a reset signal line Reset, an initial signal line Int, and a light emission control signal line EM.

A gate of the driving transistor T3 is electrically coupled to a first electrode of the compensation capacitor Cst, a source S3 of the driving transistor T3 is electrically coupled to a drain D5 of the first light emission control transistor T5, and a drain D3 of the driving transistor T3 is electrically coupled to the first electrode of the compensation capacitor Cst.

A second electrode of the compensation capacitor Cst is electrically coupled to a power supply line VDD.

A source S4 of the data writing transistor T4 is electrically coupled to a data line Data, a drain D4 of the data writing transistor T4 is electrically coupled to the source S3 of the driving transistor T3, and a gate of the data writing transistor T4 is electrically coupled to the gate line Gate.

A gate of the compensation transistor T1 is electrically coupled to the gate line Gate, a source S1 of the compensation transistor T1 is electrically coupled to a source S6 of the second light emission control transistor T6, and a drain D1 of the compensation transistor T1 is electrically coupled to the first electrode of the compensation capacitor Cst.

A gate of the first light emission control transistor T5 is electrically coupled to the light emission control signal line EM, a source S5 of the first light emission control transistor T5 is electrically coupled to the power supply line VDD, and a drain D5 of the first light emission control transistor T5 is electrically coupled to the source S3 of the driving transistor T3.

A gate of the second light emission control transistor T6 is electrically coupled to the light emission control signal line EM, the source S6 of the second light emission control transistor T6 is electrically coupled to the drain D3 of the driving transistor T3, and a drain D6 of the second light emission control transistor T6 is electrically coupled to the anode of the light emitting element.

A gate of the first reset transistor T7 is electrically coupled to the reset signal line Reset, a source S7 of the first reset transistor T7 is electrically coupled to the initial signal line Int, and a drain D7 of the first reset transistor T7 is electrically coupled to the anode of the light emitting element.

A gate of the second reset transistor T2 is electrically coupled to the reset signal line Reset, a source S2 of the second reset transistor T2 is electrically coupled to the initial signal line Int, and a drain D2 of the second Reset transistor T2 is electrically coupled to the gate of the driving transistor T3.

Figure 2:
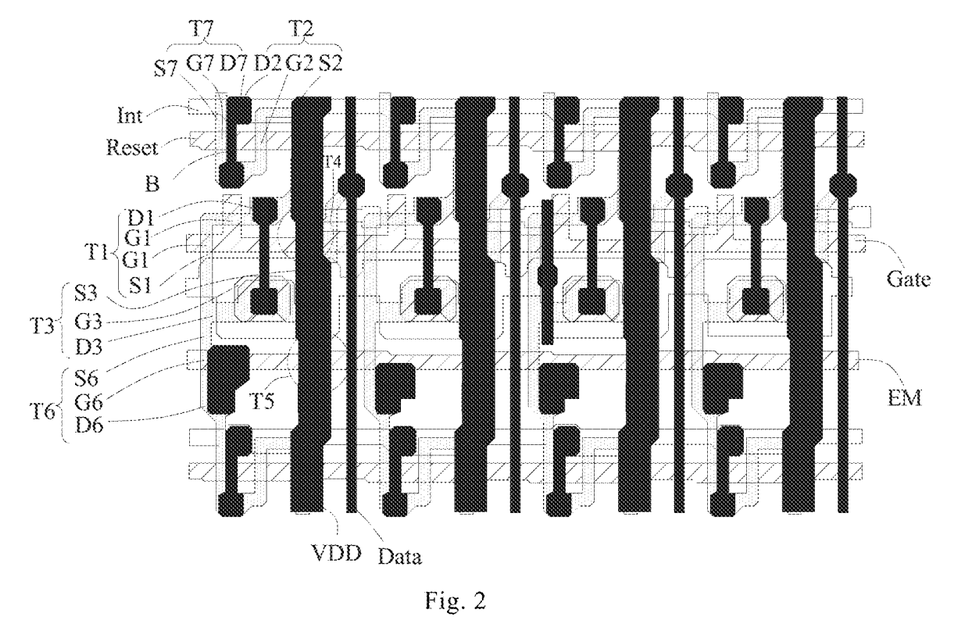
FIG. 2 is a schematic top view of a structure of a pixel circuit in a display panel according to an embodiment of the present disclosure.

The driving circuit layer includes an active pattern layer and a source-drain pattern layer along a thickness direction of the display substrate, and the source-drain pattern layer is arranged on a side, away from the base substrate, of the active pattern layer. As shown in FIG. 2, the source-drain pattern layer includes a plurality of power supply lines VDD and a plurality of data lines Data, length directions of the power supply lines DD and the data lines Data are the same as a column direction of the pixel units, each column of pixel units correspond to the power supply line VDD and the data line Data, and the power supply line VDD and the data line Data corresponding to the same column of pixel units are disposed on the same side of the column of pixel units. In the implementation shown in FIG. 2, the power supply line VDD and the data line Data are disposed at the right side of the pixel units.

In a same pixel unit, active layers of the thin film transistors of the pixel circuit are formed into an active general layer with an integrated structure in a single piece, and the active pattern layer includes a plurality of active general layers.

Figure 3:
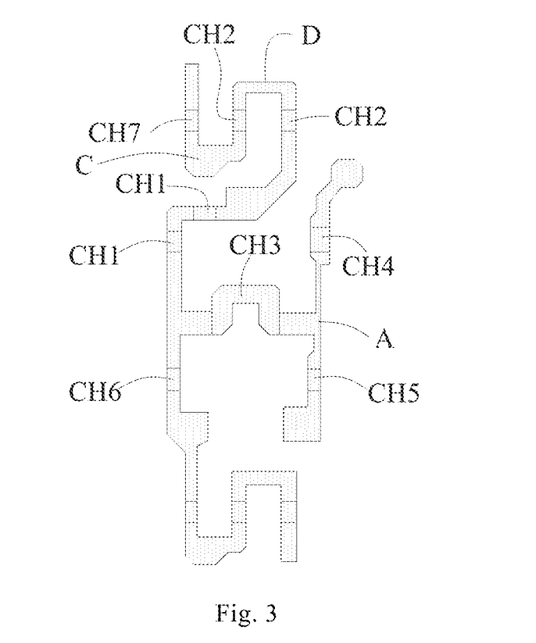
FIG. 3 is a schematic structural diagram of an active general layer.
Figure 8:
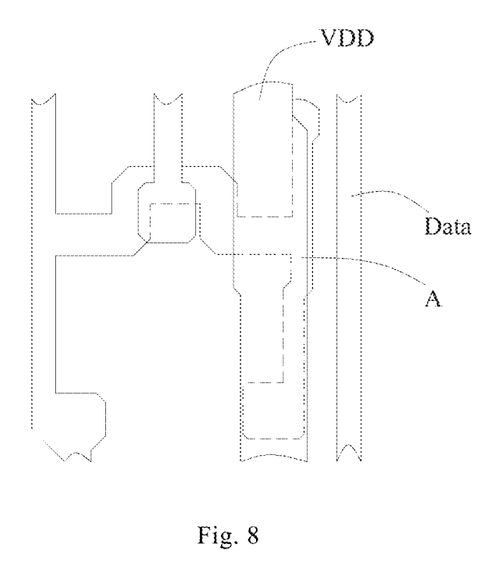
FIG. 8 is a schematic diagram showing an overlapping relationship between a first active connection portion and a power supply line.

As shown in FIGS. 2 and 3, in the same pixel circuit, the active general layer includes a first column-wise active portion including the active layer CH4 of the data writing transistor T4, an active layer CH5 of the first light emission control transistor T5, and a first active connection portion A connected between the active layer CH4 of the data writing transistor T4 and the active layer CH5 of the first light emission control transistor T5, an orthographic projection of the first active connection portion A on the base substrate at least partially overlaps an orthographic projection of the corresponding power supply line VDD on the base substrate (in FIG. 2, the "at least partially overlaps" is represented by a fact that the first active connection portion A is shielded by the power supply line VDD, in FIG. 8, an overlapping relationship between the first active connection portion A and the power supply line VDD is shown), a dimension of the first active connection portion A in a row direction of the pixel units (that is, a width of the first active connection portion) is less than a dimension of the active layer CH4 of the data writing transistor T4 in the row direction of the pixel unit, and the dimension of the first active connection portion A in the row direction of the pixel units is less than a dimension of the active layer CH5 of the first light emission control transistor T5 in the row direction of the pixel units.

The display substrate provided by the present disclosure may be matched with a light emitting element layer and a packaging layer to form a display panel. The light emitting element layer includes a plurality of light emitting elements, and the driving circuit layer is configured to drive the plurality of light emitting elements to emit light.

In the display panel, the number of pixel units is the same as the number of light emitting elements, and the higher the resolution of the display panel is, the larger the number of pixel units is, accordingly, the smaller the dimension of each pixel unit is. In the present disclosure, the active layers of the thin film transistors in the same pixel circuit are formed into the active general layer having an integrated structure in a single piece, that is, the active general layer with a relatively large dimension is manufactured by using a patterning process for providing the active layers for the thin film transistor in the same pixel unit, and thus a precision requirement on a manufacturing equipment can be reduced, and a manufacturing cost can be reduced.

In the present disclosure, the power supply line VDD and the data line Data are metal wirings. In the display substrate, the metal wirings and the active general layer of the pixel units are non-transparent film layers occupying a large proportion of a backplane circuit, and have a large influence on light transmittance of the display panel including the display substrate. Since a width of the first active connection portion is smaller, and the power supply line VDD is overlapped with the first active connection portion A, a ratio of the non-transparent film layers in the pixel units is reduced, and the light transmittance of the display panel can be improved. After the light transmittance of the display panel is improved, more pixel units can be arranged in a limited space, so that the resolution of the display panel can be improved.

The display substrate provided by the present disclosure can improve the resolution on the premise of reducing the manufacturing cost.

In the present disclosure, a material of the active general layer is not particularly limited, and for example, the active general layer may be made of a polysilicon material.

As shown in FIG. 3, in the embodiment of the present disclosure, the active layers of the compensation transistor T1, the second reset transistor T2, the driving transistor T3, the data writing transistor T4, the first light emission control transistor T5, the second light emission control transistor T6, and the first reset transistor T7 are formed as an active general layer having an integrated structure in a single piece. In order to further simplify the manufacturing process, in some implementations, the active general layers corresponding to the pixel units in the same column are formed as an integrated structure in a single piece.

Figure 4:
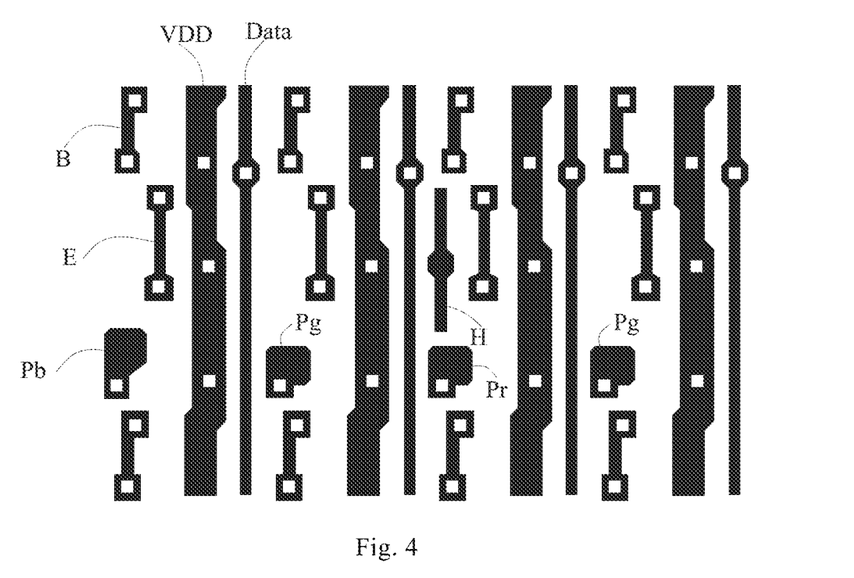
FIG. 4 is a schematic diagram of a source-drain pattern layer with unfilled boxes indicating positions of through holes.
Figure 5:
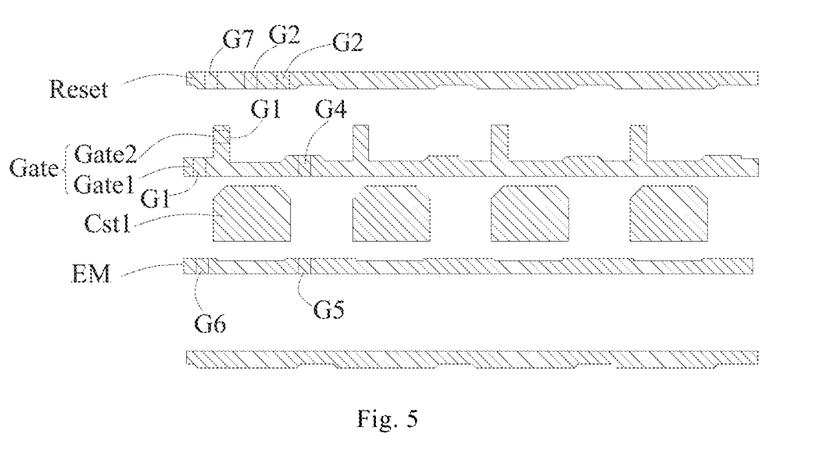
FIG. 5 is a schematic diagram of a first gate pattern layer.
Figure 6:
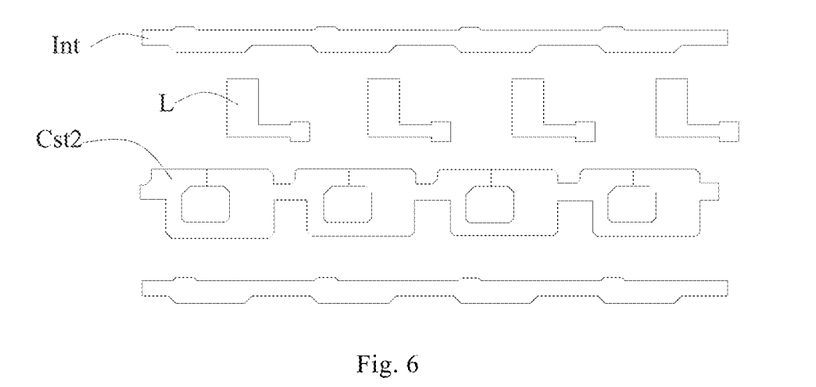
FIG. 6 is a schematic diagram of a second gate pattern layer.

Each of the compensation transistor T1, the second reset transistor T2, the driving transistor T3, the data writing transistor T4, the first light emission control transistor T5, the second light emission control transistor T6, and the first reset transistor T7 may have a top gate structure. That is, in the display substrate, in a direction away from the base substrate, an active pattern layer including active general layers, a first gate pattern layer (as shown in FIG. 5, including a gate line Gate, a light emission control signal line EM, a reset signal line Reset, a first electrode Cst1 of the compensation capacitor Cst), a second gate pattern layer (as shown in FIG. 6, including an initial signal line Int, a second electrode Cst2 of the compensation capacitor Cst, and a voltage stabilization pattern L), a source-drain pattern layer (as shown in FIG. 4, including a data line Data and a power supply line VDD) are sequentially disposed.

It should be noted that an inorganic insulating spacer layer is arranged between the active pattern layer and the first gate pattern layer, an inorganic insulating spacer layer is arranged between the first gate pattern layer and the second gate pattern layer, and an inorganic insulating spacer layer is also arranged between the second gate pattern layer and the source-drain pattern layer.

The specific layout in each pattern layer is not particularly limited. In the specific implementations shown in FIGS. 2 and 4, the data line Data and the power supply line VDD corresponding to the same column of pixel units are disposed adjacent to each other and on the same side of the pixel units.

In the same pixel unit, since the gate G1 of the compensation transistor T1 and the gate G4 of the data writing transistor T4 are both electrically coupled to the gate line Gate, for convenience of arrangement, the compensation transistor T1 and the data writing transistor T4 may be arranged side by side and spaced apart from each other. Since the data writing transistor T4 needs to be electrically coupled to the data line Data, the data writing transistor T4 is disposed closer to the data line Data than the compensation transistor T1.

The gate G5 of the first light emission control transistor T5 and the gate G6 of the second light emission control transistor T6 are both electrically coupled to the light emission control signal line EM, and for convenience of arrangement, the first light emission control transistor T5 and the second light emission control transistor T6 may be disposed side by side at an interval. Since the source S5 of the first light emission control transistor T5 needs to be electrically coupled to the power supply line VDD, the first light emission control transistor T5 is disposed closer to the power supply line VDD than the second light emission control transistor T6.

As described above, the data line Data and the power supply line VDD are adjacent to each other and disposed at the same side of the pixel units, and accordingly, the active layer (CH4 shown in FIG. 3) of the data writing transistor T4 and the active layer (CH5 shown in FIG. 3) of the first light emission control transistor T5 are also located at the same side of the pixel units.

Figure 9:
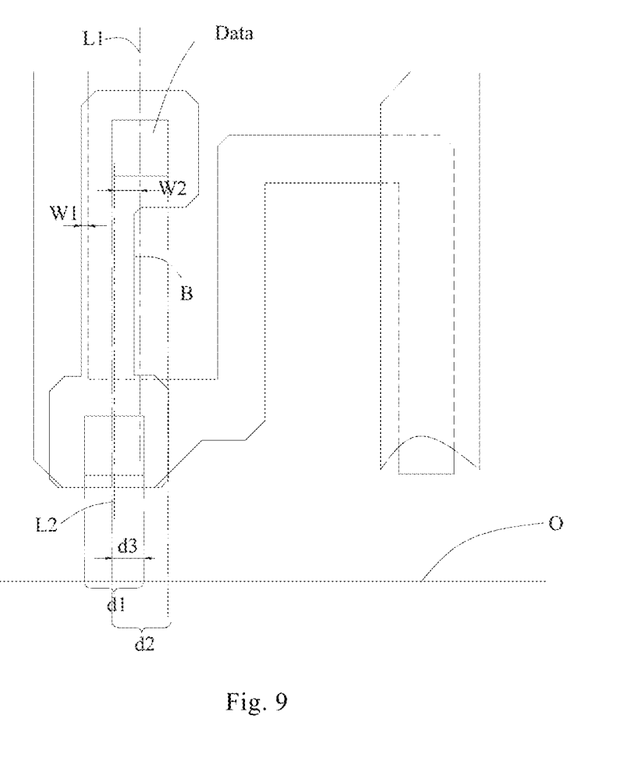
FIG. 9 is a schematic diagram showing a relative positional relationship between an initialization connector and a second column-wise active portion.

In the pixel circuit shown in FIG. 1, the first reset transistor T7 is configured to reset the anode of the light emitting element, and in the present disclosure, the first gate pattern layer may further include an initialization connector B having one end electrically coupled to the initial signal line Int through a through hole and another end coupled to a portion of the active general layer corresponding to the first reset transistor T7 through a through hole, a length direction of the initialization connector B coincides with the column direction of the pixel units, and a distance between column-directional centerlines of through holes at both ends of the initialization connector B (i.e., a distance W2 between the column-directional centerline L1 and the column-directional centerline L2 in FIG. 9) does not exceed a preset distance.

Note that the "column-directional centerline" described herein refers to a line that passes through the center of the through hole and extends in the column direction (i.e., the column-directional centerline L1 and the column-directional centerline L2 in FIG. 9).

As described above, since the distance between the column-directional centerlines of the two through holes of the initialization connector B does not exceed the preset distance, it is assumed that the initialization connector B has a substantially linear structure and has a smaller area, which is advantageous for improving the light transmittance of the pixel unit.

In the present disclosure, the preset distance is not particularly limited, as long as the initialization connector B is of a substantially linear structure. As an alternative implementation, the preset distance is between 0.1 µm and 0.5 µm.

To further ensure that the initialization connector B is of a substantially linear structure, in some implementations, there is an overlap (i.e., d3 in FIG. 9) between an orthographic projection d1 of the through hole at one end of the initialization connector B on the reference line O extending in the row direction and an orthographic projection d2 of the through hole at another end of the initialization connector B on the reference line O. The overlap between the orthographic projection d1 of the through hole at one end of the initialization connector B on the reference line O extending in the row direction and the orthographic projection d2 of the through hole at another end of the initialization connector B on the reference line O indicates that a deviation between the two ends of the initialization connector B is relatively not large. As an alternative implementation, a width of the initialization connector B does not exceed two thirds of a width of the power supply line VDD, and the width of d3 between the orthographic projection d1 of the through hole at one end of the initialization connector B on the reference line O extending in the row direction and the orthographic projection d2 of the through hole at another end of the initialization connector B on the reference line O is not less than half the width of the initialization connector B.

To further improve the light transmittance of the pixel unit, in some implementations, the active general layer includes a second column-wise active portion including the active layer CH7 of the first reset transistor T7, as shown in FIG. 3. As shown in FIG. 2, there is a partial overlap between an orthogonal projection of the initialization connector B on the base substrate and an orthogonal projection of the second column-wise active portion on the base substrate (W1 in FIG. 9 indicates an overlap width).

The second reset transistor T2 is configured to reset the gate of the driving transistor T3. Since the first reset transistor T7 and the second reset transistor T2 share the same reset signal line Reset, the first reset transistor T7 and the second reset transistor T2 may be adjacently disposed. Correspondingly, the active general layer further includes a third column-wise active portion and a fourth column-wise active portion, the third column-wise active portion and the second column-wise active portion are connected through a second active connection portion C, the fourth column-wise active portion and the third column-wise active portion are connected by a third active connection portion D, and one end of the third column-wise active portion is coupled to the second active connection portion C, another end of the third column-wise active portion is coupled to the third active connection portion D, and the corresponding reset signal line sequentially passes through the second column-wise active portion, the third column-wise active portion, and the fourth column-wise active portion, a part of the second column-wise active portion passed by the reset signal line Reset is formed as the active layer CH7 of the first reset transistor, parts of the third column-wise active portion and the fourth column-wise active portion passed by the reset signal line Reset are formed as the active layer CH2 of the second reset transistor. It can be seen that the second reset transistor has a double gate structure.

In order to facilitate the provision of the initialization connector B having a substantially linear structure, the through hole corresponding to the another end of the initialization connector B is located in the second active connection portion C.

Having described the relative positions of the first reset transistor T7 and the second reset transistor T2 in the pixel unit, for convenience of arrangement, as an alternative implementation, the compensation transistor T1, the driving transistor T3 and the second emission control transistor T6 may be sequentially arranged in the column direction at a side of the first reset transistor T7.

To facilitate the formation of the active general layer, the active layer CH1 of the compensation transistor T1 and the active layer CH6 of the second light emission control transistor T6 may be located on a same straight line to form the fourth column-wise active portion. Further, the fourth column-wise active portion including the active layer CH1 of the compensation transistor T1 and the active layer CH6 of the second light emission control transistor T6 is provided at an interval from the first column-wise active portion including the active layer CH4 of the data writing transistor T4 and the active layer CH5 of the first emission control transistor T5. The active layer of the driving transistor T3 is connected between the fourth column-wise active portion including the active layer CH1 of the compensation transistor T1 and the active layer CH6 of the second light emission control transistor T6 and the first column-wise active portion including the active layer CH4 of the data writing transistor T4 and the active layer CH5 of the first light emission control transistor T5.

In order to improve the switching performance of the compensation transistor T1, in some implementations, the compensation transistor T1 may have a double gate structure. In the present disclosure, the gate line Gate may be provided to include a transverse gate line portion Gate1 and a longitudinal gate line portion Gate2 formed on the transverse gate line portion Gate1, and a plurality of longitudinal gate line portions Gate2 are provided on each transverse gate line portion Gate 1. A length direction of the transverse gate line portion Gate1 coincides with the row direction of the pixel units.

By disposing the active general layer to pass through the transverse gate line portion Gate1 and the longitudinal gate line portion Gate2 in the same pixel unit, the compensation transistor T1 having a double gate structure can be realized.

As described above, the pixel circuit further includes the first light emission control transistor T5, the second light emission control transistor T6, the driving transistor T3, the compensation transistor T1, and the compensating capacitor Cst.

As described above, for ease of arrangement, the first electrode Cst1 of the compensation capacitor Cst may be disposed in the same layer as the gate line Gate, the emission control signal line EM, and the reset signal line Reset. In the present disclosure, the first gate pattern layer may further include a plurality of capacitive connectors E, each pixel unit is provided with the capacitive connector therein. One end of the capacitor connector E is electrically coupled to the first electrode Cst1 of the compensation capacitor Cst through a through hole, and another end of the capacitor connector E is coupled to the active general layer through a through hole, so as to form the drain D1 of the compensation transistor T1.

In the present disclosure, the first electrode Cst1 and the second electrode Cst2 of the compensation capacitor Cst are respectively located in different layers, and an interlayer distance between the second electrode Cst2 of the compensation capacitor Cst and the capacitor connector E is smaller. To facilitate to electrically couple the capacitive connector E with the first electrode Cst1 of the compensation capacitor Cst via the through hole, the compensation capacitor Cst2 may be configured to have a structure with a capacitor opening, an orthographic projection of which on the base substrate overlaps with an orthographic projection of the first electrode Cst1 of the compensation capacitor Cst on the base substrate, thereby facilitating the formation of the through hole through which the capacitive connector E and the first electrode Cst1 are coupled.

In the present disclosure, a shape of the active layer CH3 of the driving transistor T3 may also coincide with a portion of outer contour of the first electrode Cst1 of the compensation capacitor Cst.

In FIG. 4, in addition to shapes of components in the source-drain pattern layer, shapes of through holes electrically coupled to components in a second wiring pattern layer are also shown. It is to be noted that the through holes shown in FIG. 4 are all through holes penetrating through the inorganic insulating layer.

As shown in FIG. 4, two through holes are formed at both ends of the initialization connector B, respectively, and two through holes are formed at both ends of the capacitive connector E, respectively. In a direction from bottom to top in FIG. 4, three through holes are provided in the power supply line VDD, i.e., for the same pixel unit, the power supply line VDD corresponds to three through holes, including a through hole (hereinafter, referred to as a lower through hole for convenience of description) coupled to the active layer of the first light emission control transistor T5, a through hole (hereinafter, referred to as a middle through hole for convenience of description) electrically coupled to the second electrode of the compensation capacitor Cst, and a through hole (hereinafter, referred to as an upper through hole for convenience of description) coupled to a portion of the active general layer between the active layer of the compensation transistor T1 and the active layer of the second reset transistor T2. That is, in the same pixel unit, except the middle through hole, the upper through hole and the lower through hole of the three through holes corresponding to the power supply line VDD are electrically coupled to the active general layer.

The portion of the power supply line VDD coupled to the lower through hole corresponds to the source of the first light emission control transistor T5. The portion of the power supply line VDD coupled to the middle through hole corresponds to the drain of the second reset transistor T2 electrically coupled to the gate of the driving transistor T3 and the drain of the compensation transistor T1.

The display substrate may include a plurality of pixel unit groups, and each three adjacent pixel units or each four adjacent pixel units may constitute one pixel unit group.

In the case where one pixel unit group includes four pixel units, the four pixel units may be one red pixel unit, two green pixel units, and one blue pixel unit, respectively. Correspondingly, the light emitting element in the red pixel unit is a red organic light emitting diode, the light emitting element in the green pixel unit is a green organic light emitting diode, and the light emitting element in the blue pixel unit is a blue organic light emitting diode.

Figure 7:
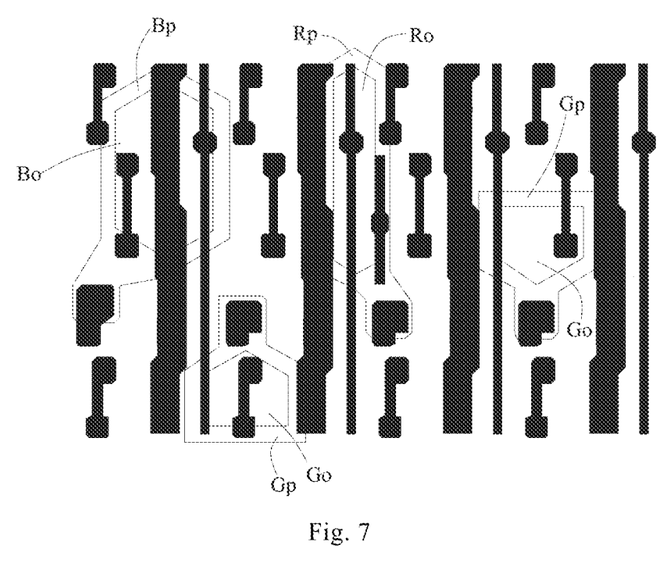
FIG. 7 shows a relative position relationship between a first wiring pattern layer and a pixel opening.

In the implementation shown in FIG. 7, the four pixel units in the same pixel unit group are arranged in following order along the row direction: the blue pixel unit (the anode pattern Bp of the blue light emitting element and the pixel opening Bo are shown), the green pixel unit (the anode pattern Gp of the green light emitting element and the pixel opening Go are shown), the red pixel unit (the anode pattern Rp of the red light emitting element and the pixel opening Ro are shown), and the green pixel unit (the anode pattern Gp of the green light emitting element and the pixel opening Go are shown).

Accordingly, the source-drain pattern layer includes anode connectors corresponding to anode patterns of three colors of light emitting diodes. Specifically, as shown in FIG. 4, the source-drain pattern layer includes the anode connector Pb of the blue light emitting diode, the anode connector Pg of the green light emitting diode, and the anode connector Pr of the red light emitting diode.

The display substrate may further include a planarization layer covering the source-drain pattern layer, the planarization layer having pixel openings formed therein corresponding to the respective pixel units, and portions of the light emitting element other than the anode electrode being formed in the pixel opening.

In the present disclosure, specific structures of portions other than the anode in the light emitting element are not particularly limited. For example, when the light emitting element is an organic light-emitting diode, the light emitting element includes a light-emitting layer and a cathode in addition to the anode.

As an alternative implementation, the light emitting layer may include a hole transport layer, an organic light emitting layer, and an electron transport layer sequentially arranged in a direction away from the anode.

For ease of manufacturing, cathodes of different light emitting elements are formed as an integrated structure in a single piece.

FIG. 7 shows shapes of pixel openings of four pixel units in the same pixel unit group. As shown in FIG. 7, in the row direction, the blue pixel unit, the green pixel unit, the red pixel unit, and the green pixel unit are arranged in such order.

The display substrate further includes a planarization layer in which pixel openings corresponding to the pixel units are formed, and portions of the light emitting element other than the anode are disposed in the pixel opening.

Among the four pixel units of the same pixel unit group, the dimension of the pixel opening Bo corresponding to the blue pixel unit along the row direction is the largest, and the dimension of the pixel opening Ro corresponding to the red pixel unit along the row direction is the smallest.

In order to obtain the planarization layer with a flat surface, as an alternative implementation, the display substrate further includes a plurality of pad width members H disposed in the same layer as the data lines, and each red pixel unit is provided with the pad width member therein, and the pad width member is disposed on a side of the red pixel unit away from the blue pixel unit. As described above, the pixel opening Ro of the red pixel unit has the smallest dimension along the row direction, and therefore, an area occupied by the planarization layer in the row direction in the red pixel unit is relatively large, and an influence of the planarization of the planarization layer on the light emitting effect of the red pixel unit is also relatively large.

During forming the planarization layer, an organic material for forming the planarization layer is first coated and then a curing process is performed. Since the red pixel unit R is provided with the pad width member H, the leveling of the organic material after the organic material is coated is facilitated, and the planarization layer with a flat surface can be formed in the curing process. As an alternative implementation, a length direction of the pad width member H coincides with a length direction of the data line Data.

Specifically, an orthographic projection of the pad width member H on the base substrate is located in an overlapping portion of an orthographic projection of the anode pattern Rp of the red pixel unit provided with the pad width member H on the base substrate and an orthographic projection of the pixel opening Ro of the red pixel unit on the base substrate.

In the present disclosure, the arrangement of the pixel openings in the same pixel unit group is not particularly limited, and in the implementation shown in FIG. 7, in the same row of pixel units, the anode connectors (anode connector Pb, anode connector Pg, anode connector Pr, and anode connector Pb) of the light emitting elements are arranged in a row, the pixel opening of the blue pixel unit, the pixel opening of the red pixel unit, and the pixel opening of the green pixel unit located at the side of the pixel opening of the red pixel unit away from the pixel opening of the blue pixel unit are located at a side of the row formed by the anode connectors, and the pixel opening of the green pixel unit located between the pixel opening of the red pixel unit and the pixel opening of the blue pixel unit is located at another side of the row formed by the anode connectors.

As a second aspect of the present disclosure, there is also provided a display panel including the above display substrate provided by the present disclosure.

Compared with a display panel which does not adopt the display substrate provided by the present disclosure in the related art, the transmittance of the display panel adopting the display substrate provided by the present disclosure is improved by at least 3%.

In some implementations, the display panel may further include an encapsulation cover plate encapsulating the display substrate, and other structures.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display substrate, comprising a base substrate, and a driving circuit layer and a plurality of light emitting elements formed on the base substrate, the display substrate being divided into a plurality of pixel units arranged in a plurality of rows and a plurality of columns, the driving circuit layer comprising a plurality of pixel circuits corresponding to the plurality of pixel units, the pixel circuits being configured to drive the light emitting elements to emit light, the driving circuit layer comprises an active pattern layer and a source-drain pattern layer along a thickness direction of the display substrate, the source-drain pattern layer is arranged on a side of the active pattern layer away from the base substrate, the source-drain pattern layer comprises a plurality of power supply lines and a plurality of data lines, length directions of the power supply lines and the data lines are the same as a column direction of the pixel units, each column of pixel units correspond to the power supply line and the data line;

the pixel circuit comprises a plurality of thin film transistors, and in the same pixel unit, active layers of the thin film transistors of the pixel circuit is formed into an active general layer with an integrated structure in a single piece, and the active pattern layer comprises a plurality of active general layers;

the thin film transistors of the pixel circuit comprise a data writing transistor and a first light emission control transistor, and in the same pixel circuit, the active general layer comprises a first column-wise active portion comprising the active layer of the data writing transistor, the active layer of the first light emission control transistor, and a first active connection portion connected between the active layer of the data writing transistor and the active layer of the first light emission control transistor;

wherein the thin film transistors of the pixel circuit comprise a first reset transistor configured to reset an anode of the light emitting element;

in the thickness direction of the display substrate, the driving circuit layer comprises a first gate pattern layer and a second gate pattern layer which are arranged in a stacked mode, the second gate pattern layer is located on a side, away from the active pattern layer, of the first gate pattern layer;

the second gate pattern layer comprises an initial signal line, the source-drain pattern layer further comprises an initialization connector, one end of the initialization connector is electrically coupled to the initial signal line through a through hole, another end of the initialization connector is coupled to a portion, corresponding to the first reset transistor, of the active general layer through a through hole; and wherein there is an overlap between an orthographic projection of the through hole at one end of the initialization connector on a reference line extending in the row direction and an orthographic projection of the through hole at another end of the initialization connector on the reference line.

2. The display substrate of claim 1, wherein the first gate pattern layer and the second gate pattern layer both are located between the active pattern layer and the source-drain pattern layer.

3. The display substrate of claim 1, wherein a length direction of the initialization connector is consistent with the column direction of the pixel units, and a distance between centerlines, in the column direction, of through holes at two ends of the initialization connector is less than or equal to a preset distance.

4. The display substrate of claim 3, wherein the preset distance is between 0.1 μm and 0.5 μm.

5. The display substrate of claim 1, wherein an orthographic projection of the first active connection portion on the base substrate at least partially overlaps an orthographic projection of the corresponding power supply line on the base substrate.

6. The display substrate of claim 1, wherein a dimension of the first active connection portion in a row direction of the pixel units is less than a dimension of the active layer of the data writing transistor in the row direction of the pixel units, and the dimension of the first active connection portion in the row direction of the pixel units is less than a dimension of the active layer of the first light emission control transistor along the row direction of the pixel units.

7. The display substrate of claim 1, wherein the power supply line and the data line corresponding to the same column of pixel units are arranged on a same side of the column of pixel units.

8. The display substrate of claim 1, wherein the first gate pattern layer comprises a reset signal line.

9. The display substrate of claim 8, wherein the active general layer comprises a second column-wise active portion, the second column-wise active portion comprises the active layer of the first reset transistor, and an orthographic projection of the initialization connector on the base substrate partially overlaps with an orthographic projection of the second column-wise active portion on the base substrate.

10. The display substrate of claim 9, wherein the pixel circuit comprises a second reset transistor and a driving transistor, the second reset transistor is configured to reset a gate of the driving transistor;

the active general layer further comprises a third column-wise active portion and a fourth column-wise active portion, the third column-wise active portion is coupled to the second column-wise active portion through a second active connection portion, the fourth column-wise active portion is coupled to the third column-wise active portion through a third active connection portion, and one end of the third column-wise active portion is coupled to the second active connection portion, another end of the third column-wise active portion is coupled to the third active connection portion, and the corresponding reset signal line sequentially passes through the second column-wise active portion, the third column-wise active portion, and the fourth column-wise active portion, a part of the second column-wise active portion passed by the reset signal line is formed as the active layer of the first reset transistor, parts of the third column-wise active portion and the fourth column-wise active portion passed by the reset signal line are formed as the active layer of the second reset transistor;

the through hole corresponding to the another end of the initialization connector is positioned in the second active connection portion.

11. The display substrate of claim 1, wherein the first gate pattern layer further comprises a plurality of gate lines, each row of the pixel units corresponds to the gate line, the pixel circuit comprises a compensation transistor, the gate line comprises a transverse gate line portion and a longitudinal gate line portion, each pixel unit corresponds to one longitudinal gate line portion, and the active layer of the compensation transistor comprises a portion of the active general layer passing through the transverse gate line portion and a portion of the active general layer passing through the longitudinal gate line portion.

12. The display substrate of claim 1, wherein each four adjacent pixel units form a pixel unit group, and the four pixel units are respectively one red pixel unit, two green pixel units and one blue pixel unit.

13. The display substrate of claim 12, wherein in the same pixel unit group, the four pixel units are arranged in the row direction in the following order:

the blue pixel unit, the green pixel unit, the red pixel unit and the green pixel unit.

14. The display substrate of claim 12, further comprising a planarization layer disposed on a side of the source-drain pattern layer away from the base substrate, wherein pixel openings corresponding to the pixel units are formed in the planarization layer, a portion of the light emitting element other than the anode is disposed in the pixel opening, in the four pixel units of the same pixel unit group, the pixel opening corresponding to the blue pixel unit has the largest dimension along the row direction, and the pixel opening corresponding to the red pixel unit has the smallest dimension along the row direction.

15. The display substrate of claim 12, further comprising a plurality of pad width members disposed in the same layer as the data lines, wherein each red pixel unit has the pad width member disposed therein, and the pad width member is disposed on a side of the red pixel unit away from the blue pixel unit.

16. The display substrate of claim 15, wherein an orthogonal projection of the pad width member on the base substrate is located in an overlapping portion of an orthogonal projection of an anode pattern of the red pixel unit disposed with the pad width member on the base substrate and an orthogonal projection of the pixel opening of the red pixel unit on the base substrate.

17. The display substrate of claim 15, wherein a length direction of the pad width member coincides with a length direction of the data line.

18. The display substrate of claim 12, wherein the source-drain pattern layer comprises a plurality of anode connectors, each light emitting element corresponds to one anode connector, the anode connectors are electrically coupled to the anode patterns of the corresponding light emitting elements, and in the same row of pixel units, the anode connectors corresponding to the light emitting elements are arranged in a row.

19. The display substrate of claim 18, wherein the pixel opening of the blue pixel unit, the pixel opening of the red pixel unit, and the pixel opening of the green pixel unit located on a side of the pixel opening of the red pixel away from the pixel opening of the blue pixel unit are located on a side of the row formed by the anode connectors, and the pixel opening of the green pixel unit located between the pixel opening of the red pixel unit and the pixel opening of the blue pixel unit is located on another side of the row formed by the anode connectors.

20. A display panel, comprising the display substrate of claim 1.

* * * * *